United States Patent [19]

Itou et al.

[11] Patent Number: 5,552,342
[45] Date of Patent: Sep. 3, 1996

[54] METHOD FOR PRODUCING A CONTACT HOLE IN A SEMICONDUCTOR DEVICE USING REFLOW AND ETCH

[75] Inventors: Hiroyasu Itou, Nagoya; Tosiyuki Morisita, Iwakura; Takanori Simamoto, Okazaki, all of Japan

[73] Assignee: Nippondenso Co., Ltd., Kariya, Japan

[21] Appl. No.: 293,247

[22] Filed: Aug. 19, 1994

[30] Foreign Application Priority Data

Aug. 20, 1993 [JP] Japan .................................. 5-206263

[51] Int. Cl.$^6$ .................................................. H01L 21/28
[52] U.S. Cl. .......................... 437/195; 437/28; 437/41; 437/247; 437/982
[58] Field of Search .................................. 437/195, 982, 437/203, 247, 190, 240, 28, 41; 148/DIG. 133

[56] References Cited

U.S. PATENT DOCUMENTS

| | | | |
|---|---|---|---|
| 4,495,220 | 1/1985 | Wolf et al. | 437/195 |
| 4,948,743 | 8/1990 | Ozoki | 437/235 |
| 5,166,088 | 11/1992 | Veda et al. | 437/982 |
| 5,166,101 | 11/1992 | Lee et al. | 437/238 |

FOREIGN PATENT DOCUMENTS

| | | | |
|---|---|---|---|
| 56-116641 | 9/1981 | Japan | 437/982 |
| 57-066651 | 4/1982 | Japan | 437/982 |
| 60-142543 | 7/1985 | Japan | 148/DIG. 133 |
| 64-42818 | 2/1989 | Japan . | |
| 2213129 | 11/1990 | Japan . | |
| 458534 | 2/1992 | Japan . | |

*Primary Examiner*—George Fourson
*Assistant Examiner*—Thomas G. Bilodeau
*Attorney, Agent, or Firm*—Cushman, Darby & Cushman

[57] ABSTRACT

An LOCOS film is formed on an Si substrate, a gate oxide film and a gate electrode are formed thereon, and source/drain impurities are ion implanted into the Si substrate using the gate electrode as a mask. Then, a BPSG film is formed at a film density of 1.8 g/cm$^3$ or more. A recessed part is formed in the BPSG film by the first photolithographic process with an etching depth of 20% or more but under 100% of the thickness of the BPSG film. Thereafter, the BPSG film is fluidized by reflow treatment to shape a part which is to be a contact hole into a funnel with an "upwards convex" curvature. Finally, the part formed into the funnel is etched to make a contact hole. As a result, wiring disconnection within the contact hole can be prevented, the diffusion depth controllability for the source/drain impurities can be improved, and the fall in the impurity density in the source/drain surface can be prevented.

2 Claims, 8 Drawing Sheets

D1>D2

PRIOR ART FIG. 4A
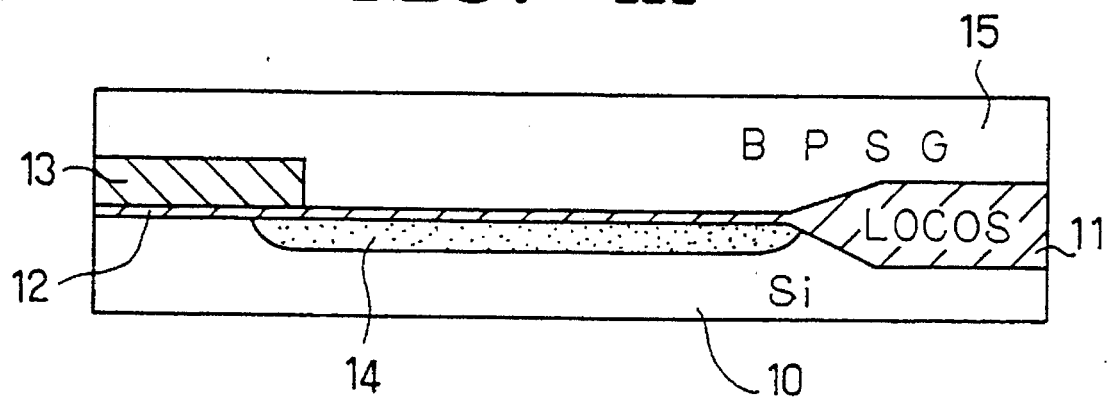
PRIOR ART FIG. 4B
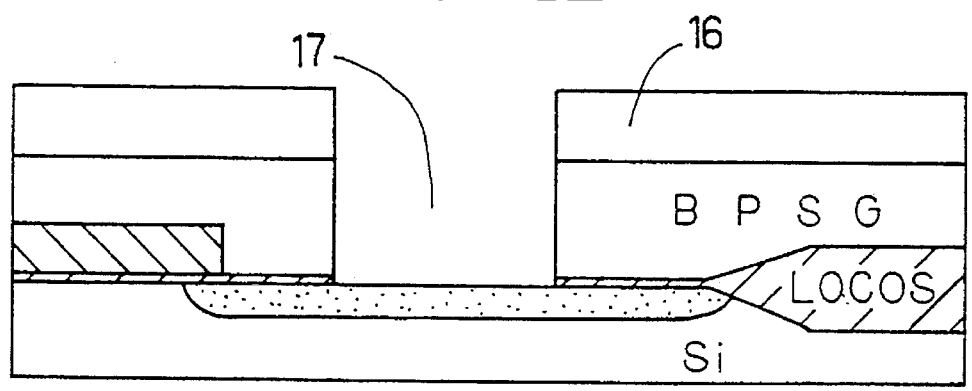
PRIOR ART FIG. 4C
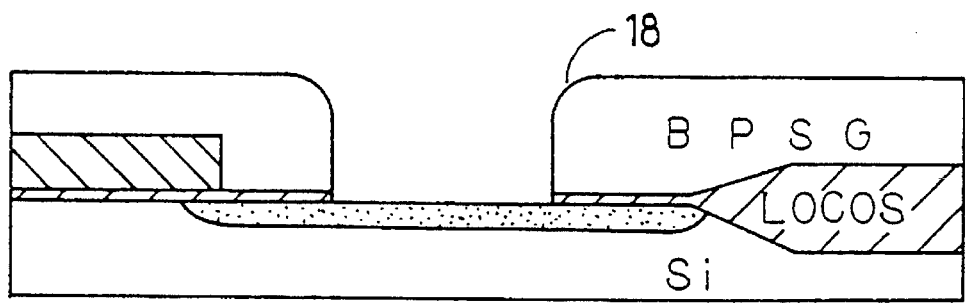

PRIOR ART FIG. 5A
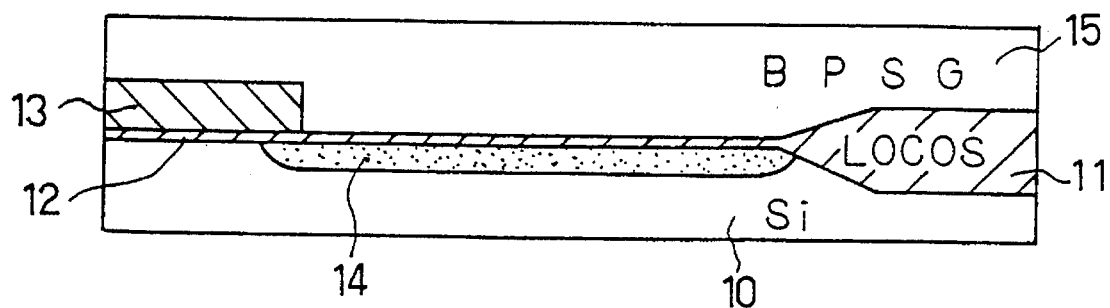
PRIOR ART FIG. 5B
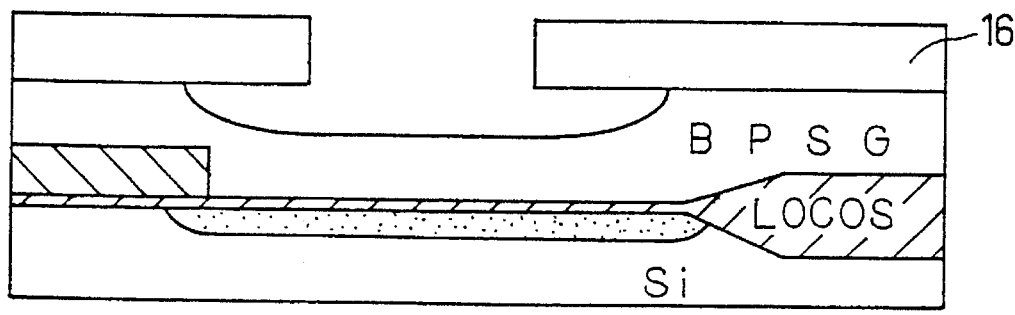
PRIOR ART FIG. 5C
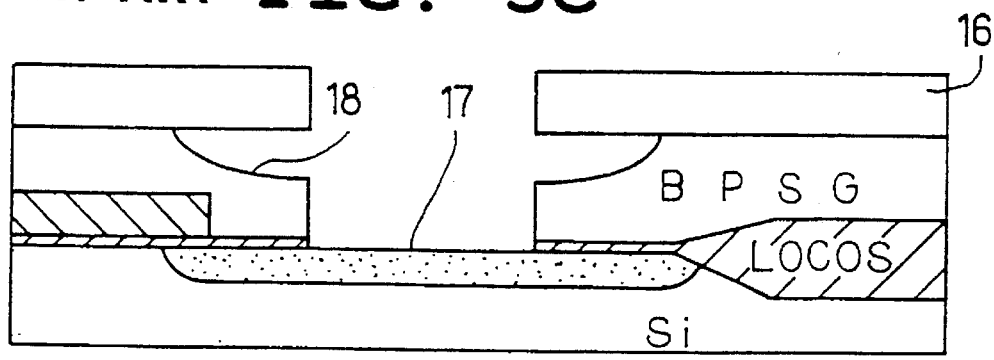

METHOD FOR PRODUCING A CONTACT HOLE IN A SEMICONDUCTOR DEVICE USING REFLOW AND ETCH

BACKGROUND OF THE INVENTION

1. Field of the Invention

The present invention generally relates to a method of minutely producing a highly integrated semiconductor device. More particularly, the present invention relates to a method of forming a contact hole for electrically connecting elements formed on a semiconductor substrate to one another or to other elements outside the semiconductor substrate.

2. Description of the Related Arts

Recently, due to the development of a VLSI into a higher speed type circuit reducing the wiring resistance of a semiconductor device has been demanded. Particularly in each element of the semiconductor device, reducing the contact resistance at a contact part which electrically and mutually connects a metal wiring member and a semiconductor substrate, has been demanded. The contact resistance referred to here comprises two resistances: the contact resistance between a wiring metal and an Si substrate, and the contact resistance of the metal wiring filling a contact hole.

As the size of the semiconductor device is decreased to achieve the higher integration of the VLSI, the size of the contact hole has become smaller, and the aspect ratio (the ratio of contact hole depth to contact hole size) has become larger. Along with this increasingly minute arrangement of the VLSI, the contact resistance has become larger due to decrease in contact area, and the step coverage or buried condition of the wiring metal in the vicinity of the contact hole has degraded due to the increase in the aspect ratio of the contact hole. In addition, there is a problem that if the step coverage is further degraded, the wiring metal will be disconnected within the contact hole.

As a measure to counter the increase in the contact resistance, it has generally been known that a metal with a high melting point, such as Ti, or the silicide thereof is used to reduce the contact resistance.

As a measure to counter the disconnection of the wiring metal within the contact hole, the techniques illustrated in FIGS. 4A to 4C and FIGS. 5A to 5C have generally been known. These techniques will now be described referring to these figures. It should be noted, however, that these figures illustrate those cases in which the contact is provided in the diffusion layer of an MOSFET.

As illustrated in FIG. 4A, an LOCOS film 11 is formed on an Si substrate 10, a gate insulating film 12 and a gate electrode 13 are formed thereon, a source/drain diffusion region 14 is formed, and an interlayer insulating film 15 is formed on top. Generally, the interlayer insulating film 15 uses a BPSG (boronphosphosilicate glass) film 15 containing boron and phosphorus, which is a CVD oxide film containing impurities, to insulate the wiring metal from the gate electrode and level the wafer surface. Furthermore, making use of the fluidity of the BPSG film at a high temperature, the first heat treatment (reflow treatment generally at 900° C.±50° C.) is performed to level the substrate. Then, as illustrated in FIG. 4B, a contact hole 17 is formed by anisotropic etching in photolithographic process using a photoresist 16 as a mask. Next, as illustrated in FIG. 4C, the second heat treatment is performed at the same temperature as that of the reflow treatment to round the square corners of the opening part 18 of the contact hole 17. By these two heat treatments, the surface is levelled and the opening part 18 is shaped into a funnel with an "upwards convex" curvature.

On the other hand, in the conventional method illustrated in FIGS. 5A to 5C, and as described above, the BPSG film 15 is formed and a reflow treatment is performed for levelling the BPSG film 15 as illustrated in FIG. 5A. Isotropic etching is applied to improve the shape of the opening part 18 of the contact hole as illustrated in FIG. 5B, and then anisotropic etching is applied down to the Si substrate to form the funnel shaped contact hole 17.

In the former method illustrated in FIGS. 4A to 4C; and, however, two heat treatments are performed to improve the shape of the contact hole formed in the interlayer insulating film after forming the source/drain region. Accordingly, this process poses a problem in that, against the demand that the junction depth of the source/drain region should be shallowed to meet the requirements of the minute production of the VLSI, the impurities are further diffused by the excessive heat treatments and consequently the junction depth of the source/drain region is deepened. Another problem is that, as the second heat treatment is performed after the contact hole is formed, impurities forming the source/drain layer separate from the Si substrate surface to the outside, or boron and phosphorus separated from the BPSG film at the side of the contact hole diffuse to the Si substrate surface, and therefore the impurity density in the source/drain surface changes and contact resistance is degraded.

In the latter method illustrated in FIGS. 5A to 5C, as the opening part of the contact hole formed in the interlayer insulating film is shaped with a "downwards convex" curvature, when the metal particles of the wiring metal film actively migrate in the formation of the wiring metal film, the viscosity between the BPSG film and the metal particles becomes lower, and consequently a ball shaped "pool" of the metal film is caused around the opening part of the contact hole. When this "pool" develops larger, it clogs the passage of the metal particles to the inside of the contact hole. As a result, a hollow part is formed within the contact hole. Consequently, the wiring resistance within the contact hole increases, or the wiring is disconnected and the production yield falls.

SUMMARY OF THE INVENTION

Therefore, it is an object of the present invention to provide a high yielding method for minutely producing a semiconductor device which has no wiring disconnection within a contact hole and no excessive diffusion of impurities implanted into a semiconductor substrate.

In order to achieve the above objects, the method for producing a semiconductor device according to the present invention is characterized by a step for implanting impurity ions into a semiconductor substrate, a step for forming a protective film over the semiconductor substrate, a step for forming a recessed part in the protective film over the semiconductor substrate into which the impurity ions have been implanted by etching the desired position of the protective film to such an extend that the recessed part does not reach the semiconductor substrate, a heat treatment step for deforming the shape of the protective film surface including the recessed part, and a step for forming a contact hole in the protective film by fully etching the recessed part.

According to the present invention, a protective film is formed on a semiconductor substrate, and heat treatment is performed after forming a recessed part by half etching the protective film in a position in which the opening part of a contact hole is to be formed. During this heat treatment, the protective film surface is levelled and at the same time a partial contact hole is formed whose opening part is funnel shaped with an "upwards convex" curvature. Also, during the heat treatment, impurities implanted into the semiconductor substrate are activated, and therefore there is no problem of redillusion of the impurities due to overheating. Furthermore, during the heat treatment, the protective film is left on the surface of the semiconductor substrate, and therefore there is no separation of the impurities from the semiconductor substrate surface to the outside.

BRIEF DESCRIPTION OF THE DRAWINGS

This invention will now be described with reference to the accompanying drawings, of which:

FIGS. 4A, 4B and 4C are cross-sectional views of a semiconductor device by means of a conventional method illustrating respective production steps;

FIGS. 5A, 5B and 5C are cross-sectional views of a semiconductor device by means of another conventional method illustrating respective production steps;

DESCRIPTION OF THE PREFERRED EMBODIMENTS

A method for producing a semiconductor device as the first embodiment according to the present invention will now be described with reference to FIGS. 1, 2A, 2B and 2C.

Figure 1:
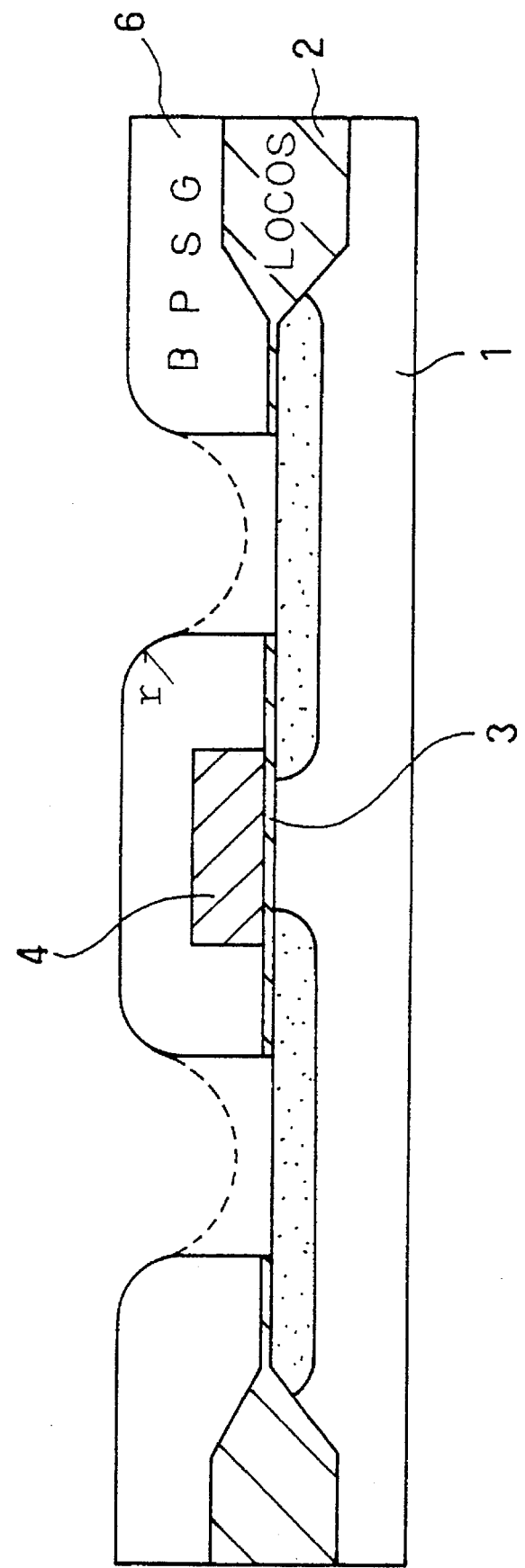
FIG. 1 is a cross-sectional view of a semiconductor device produced by means of the first embodiment according to the present invention illustrating the state before metal wiring is formed.
Figure 2A:
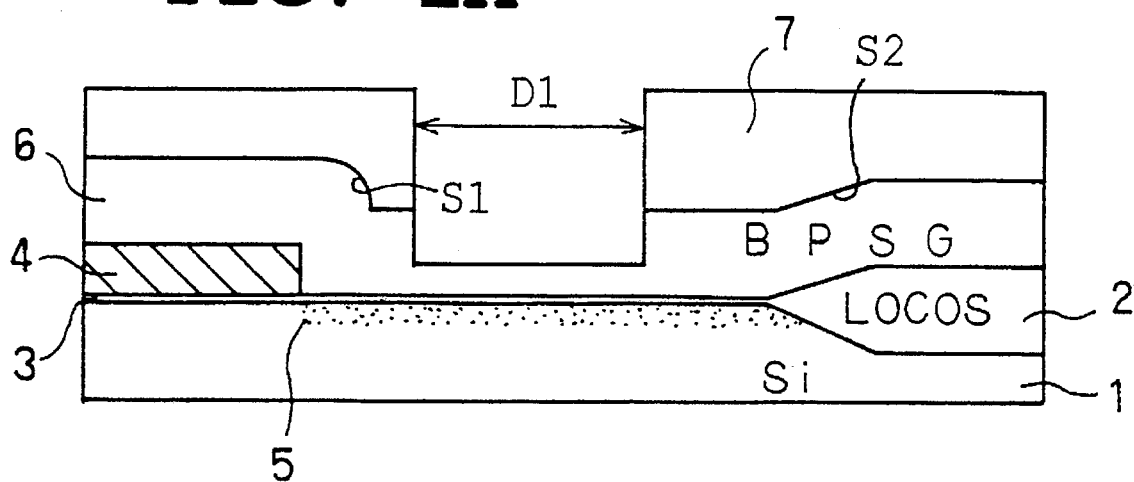
FIGS. 2A, 2B and 2C are cross-sectional views of a half finished semiconductor device by means of the first embodiment according to the present invention illustrating respective production steps.

As illustrated in FIG. 2A, an LOCOS film 2 is formed on an Si substrate 1, a gate insulating film 3 and a gate electrode 4 are formed thereon, and impurities 5 for formation of source/drain region are ion implanted using the gate electrode 4 as a mask. Then, an interlayer insulating film 6 is formed to insulate a wiring metal from the gate electrode 4 or the Si substrate 1. In this embodiment, as the interlayer insulating film 6, a CVD oxide film containing impurities (e.g., a generally used BPSG film 6) is formed. Thereafter, the first anisotropic etching is performed by using a resist mask 7 with opening width D1 by means of the first photolithographic process to form a recessed part in a position in which a contact hole 9 (FIG. 2C) will be made. At this time, the anisotropic etching amount should be limited to be 20% or more but under 100% of the thickness of the formed BPSG film 6. That is, the BPSG film 6 is not etched so deeply as to reach the surface of the Si substrate 1. Thus, the impurities are not discharged from the Si substrate 1 by subsequent heat treatment. As described herein, the film density immediately after the formation of the BPSG film 6 should preferably be 1.6 g/cm$^3$ or more. Incidentally, it is possible that ion seeds which have the same conductivity as that of the impurities 5 for forming a source/drain area are ion implanted through the remaining BPSG film 6 after the formation of the recessed part. This ion implantation of the ion seeds can further reduce the contact resistance.

Figure 2B:
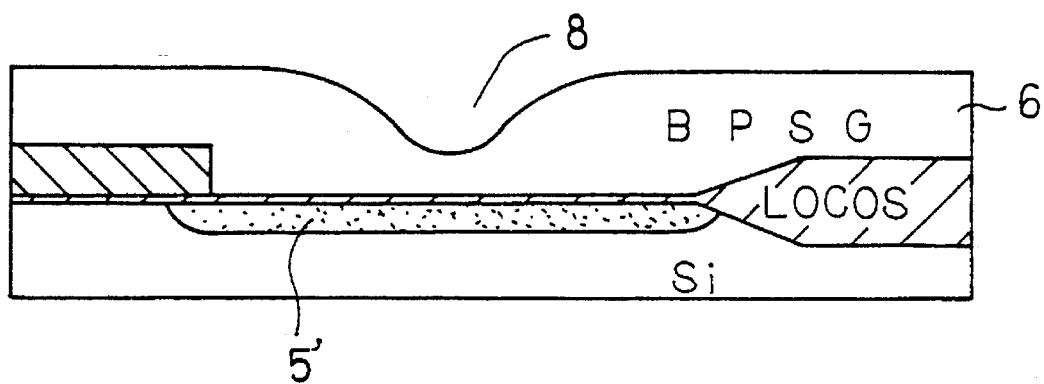

As illustrated in FIG. 2B, heat treatment (i.e., reflow treatment) is applied to the semiconductor device after removing the resist mask 7 to level the Si substrate. This reflow treatment is performed at 930° C. for 20 minutes, for example.

By this reflow treatment, the impurities 5 ion implanted before the formation of the BPSG film 6 are activated, and a source/drain region 5' is formed. The BPSG film 6 at the recessed part formed in the position in which the contact hole 9 (FIG. 2C) is to be made flows, and a recess 8 which has an "upwards convex" curvature in a position to which the opening part of the contact hole 9 (FIG. 2C) corresponds is formed. At the same time, steps S1 and S2 illustrated in FIG. 2A are levelled. In this embodiment, it is advisable that the fellow treatment conditions should be set by taking the reflow angle (i.e., curvature) and the diffusion depth of the source/drain region 5' into account.

Figure 2C:
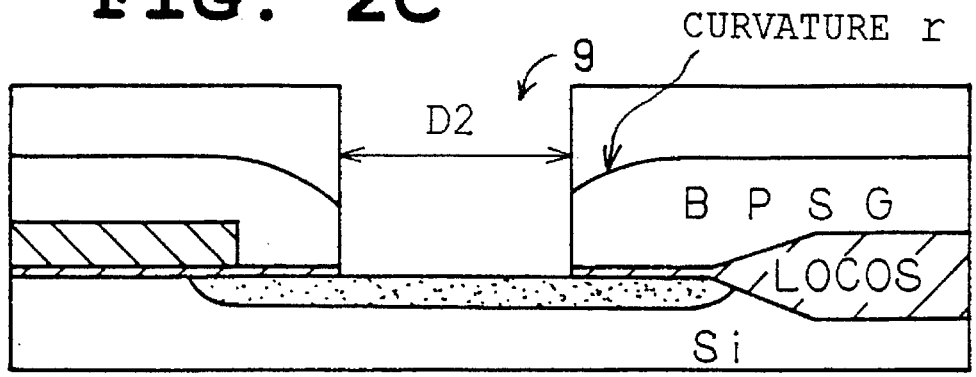

After the above, as illustrated in FIG. 2C, the second photolithographic process and the second anisotropic etching process are performed. By these processes, the contact hole 9 is formed so deeply as to reach the source/drain region 5' formed over the surface of the Si substrate 1. It is advisable here that the contact opening width D2 of the contact hole 9 should be set smaller than the opening width D1 illustrated in FIG. 2A to enlarge the curvature r of the opening part of the contact hole 9. This is because the larger the curvature r is, the better the buried condition of a metal film to be formed thereafter will be.

Then, the wiring metal is formed by using techniques known to the public. At this time, for the purpose of reducing the contact resistance, a TiN film may be formed for a thickness of approximately 100 nm prior to the formation of the intended wiring material, or instead of the TiN film, a film containing Al as a main ingredient, such as Al/Si/Cu, may be formed. For this film formation, it is advisable that the high temperature sputtering method that has a high migration effect during the film formation process should preferably be used (substrate temperature in film formation= 450° C.).

In the following passages, the BPSG film 6 and the recessed part formed in the BPSG film 6 in this embodiment will be described.

Firstly, the BPSG film 6 will be described based on the experiment by the inventors of the present invention.

It is generally known that the PSG (phosphosilicate glass) film and BPSG film, both of which contain high density impurities and are used as fellow films for levelling, are highly hygroscopic and unstable. It is reported that when moisture diffuses through these CVD oxide films containing high density impurities, phosphorous and boron, which are the impurities implanted into these films, elute, and that, for example, phosphorous reacts to water and generates $H_3PO_4$ and therefore aluminum used as a wiring metal is corroded. Generally, in order to prevent this problem and also to improve the moisture resistance immediately after the BPSG film formation, high temperature reflow treatment (at approx. 900° C.) is performed.

In this embodiment, however, reflow treatment is not performed immediately after the formation of the BPSG film but after the formation of the "recessed part" in the position in which the contact hole is to be formed by means of the first photolithographic process. In this arrangement, however, it is presumed that the BPSG film absorbs moisture between the BPSG film formation and the reflow treatment process.

In order to prevent such moisture absorption in this embodiment, the BPSG film density immediately after the film formation is limited to approximately 1.8 g/cm$^3$, and the film is formed by the plasma CVD method using TEOS (tetraethyl ortlo-silicate) instead of SiH$_4$ gas as a source and TMP (tri-methyl phosphate) and TMB (tri-methyl borate) as impurity additives (P density: 4.5±0.5 wt %; B density: 3.0±0.3 wt %; film density: 1.8–2.0 g/cm$^3$). By using this method, the hygroscopicity of the BPSG film was analyzed by FT-IR, the results of which are shown in FIG. 6.

Figure 6:
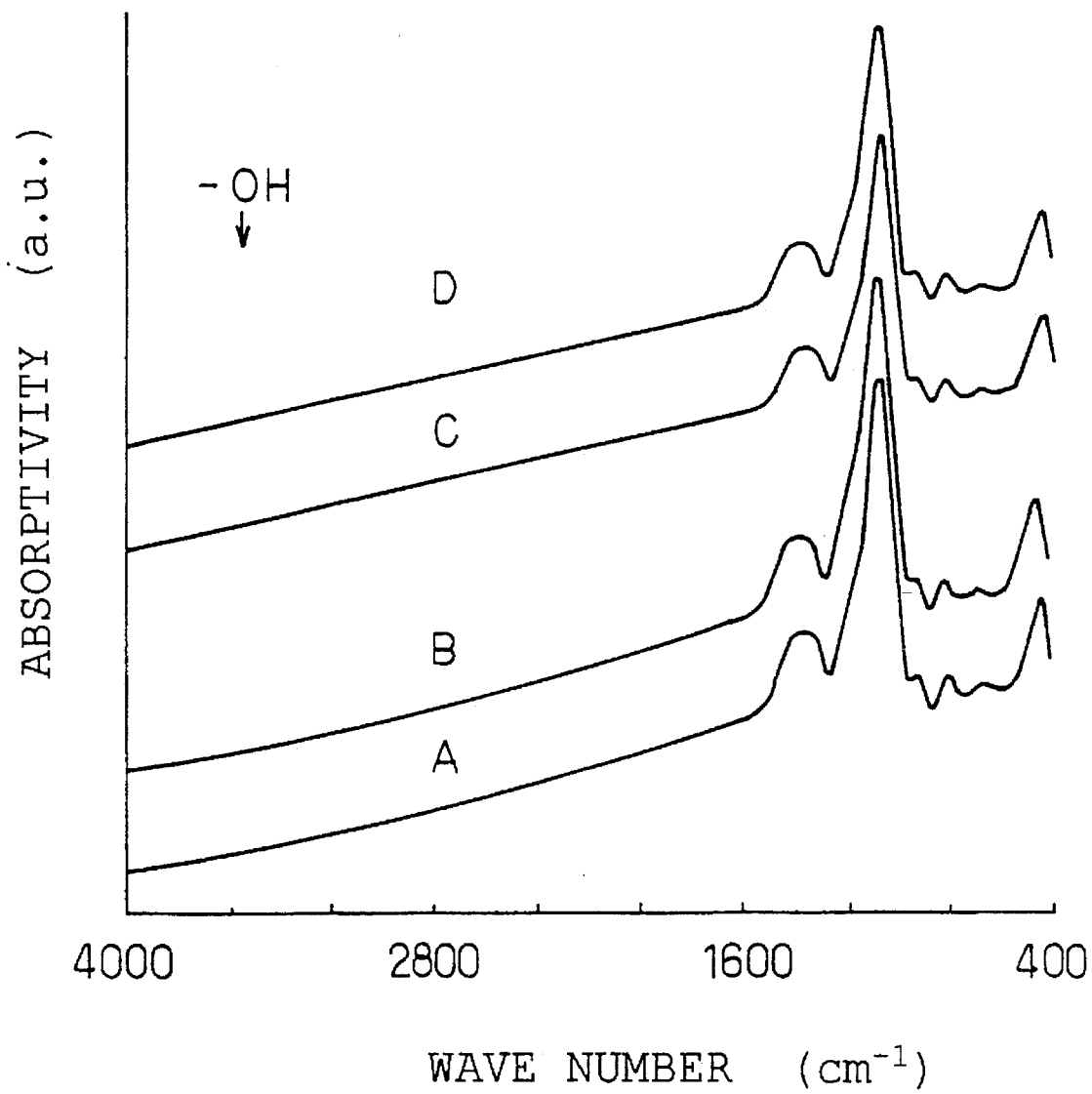
FIG. 6 is a graph illustrating the FT-IR characteristics of a BPSG film.

FIG. 6 illustrates Spectral A immediately after the formation the BPSG film by the method as described above, Spectral B after leaving the BPSG film for 24 hours from formation and brush washing the BPSG film with pure water, Spectral C after brush washing the BPSG film and then etching the BPSG film with dilute hydrofluoric acid for approximately ⅓ of the total film thickness, and Spectral D after washing the BPSG film with a mixed liquid of concentrated sulfuric acid and hydrogen peroxide of generally used type to exfoliate the photoresist after the etching.

As it is evident from FIG. 6, in the BPSG film with TEOS base by using the plasma CVD method of this embodiment, no change can be seen in spectral due to various water washing after the film formation. Particularly, as no absorption by -OH group which is supposed to appear within a range of wave number from 3650 cm$^{-1}$ to 3200 cm$^{-1}$, the hygroscopicity is deemed to be sufficiently low, and therefore the above BPSG film is deemed to be sufficiently usable. For information, according to the measurement by the inventors of the present invention, the same results were obtained when the film density was 1.7 g/cm$^3$. Therefore, considering an error, it is considered sufficient that the film density is 1.6 g/cm$^3$ or more. Also, it was confirmed that by using the BPSG film with TEOS, the fluidity during the reflow treatment was improved.

Next, in the following passages, the shape of the recessed part formed in the BPSG film will be described based on the results of the experiment by the inventors of the present invention.

Figure 7:
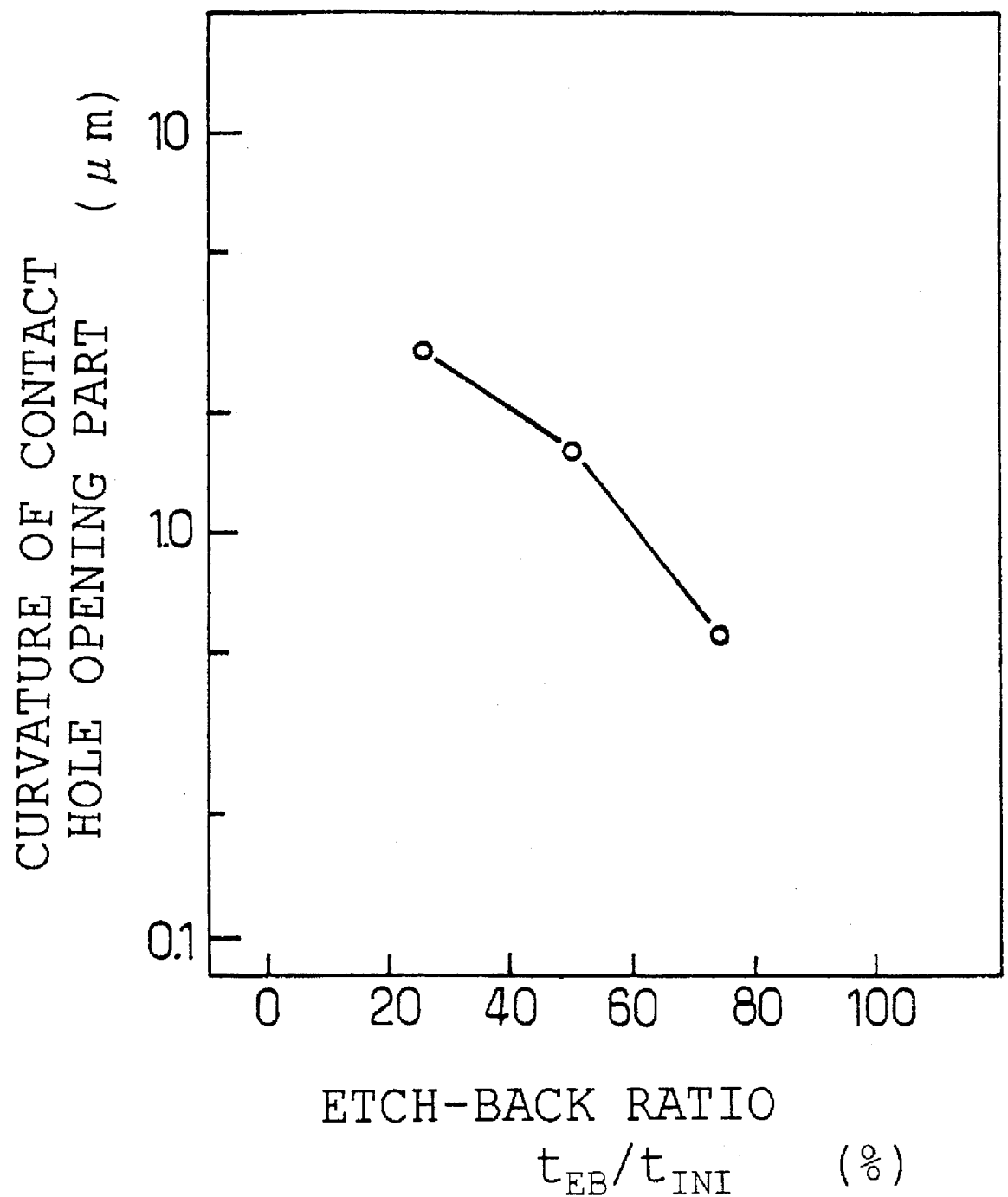
FIG. 7 is a graph illustrating the relation between the depth of the half etching of the BPSG film and the curvature of the opening part of a contact hole.

After forming the above recessed part, the relation between the curvature around the opening part formed by reflow treatment and the etch-back ratio by means of the first anisotropic etching process was measured. The results of this measurement are illustrated in FIG. 7 (etching depth: $t_{EB}$, initial BPSG film: $t_{INI}$). The curvature around the opening part in this case is a curvature from the flat part of the BPSG film indicated by "r" in FIG. 1 to the top part of the contact hole formed by the second anisotropic etching process. When the etching ratio is 0, i.e., when the etching amount in the first anisotropic etching process is 0, the curvature r around the opening part is infinite (r=∞).

From FIG. 7, it is evident that as the etching ratio increases, i.e., as the etching depth increases, the curvature of the opening part exponentially decreases, and the curvature around the opening part of the contact hole becomes steep.

Figure 8:
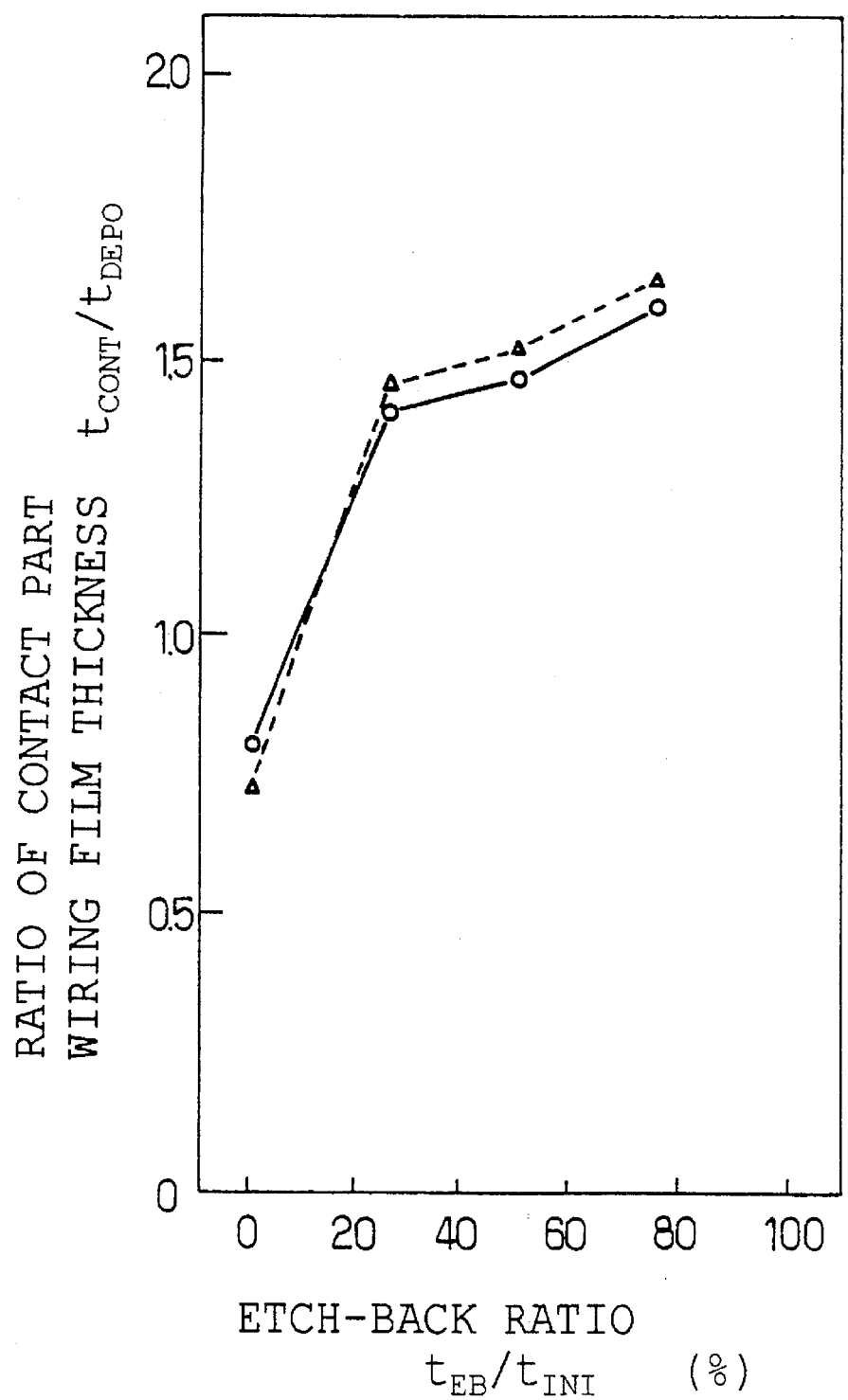
FIG. 8 is a graph illustrating the relation between the depth of half etching of the BPSG film and the thickness of a wiring film.

FIG. 8 illustrates the buried condition of the wiring metal film in relation to the contact hole with the variance of the "upwards convex" curvature r around the opening part thereof formed by performing reflow treatment after the formation of the recessed part. This figure illustrates the relation between the wiring metal film thickness ratio of the contact part (wiring metal film thickness inside the contact hole: $t_{CONT}$; wiring metal film thickness at the flat part: $t_{DEPO}$) and the etch-back ratio as defined above. Also in this figure, two different sizes of the contact hole were experimented, and the contact hole of ϕ1.0 μm is indicated by a solid line, and the contact hole of ϕ0.8 μm is indicated by a broken line. The wiring metal used was of a lamination structure with a TiN family barrier metal and Al/Si/Cu, and the upper layer of Al/Si/Cu was formed by using the high temperature sputtering method (substrate temperature during the film formation: 450° C.) that has a high migration effect. The thickness of the wiring metal film formed in the above process was set to 500 nm, which is the same as the depth of the contact hole. This means that when the wiring metal film thickness ratio of the contact part was 1.0, the wiring metal was completely buried into the contact hole (burying ratio=100%).

As it is evident from FIG. 8, compared with a case where the etch-back ratio is 0% when the etch-back ratio is larger than or equal to 20% the wiring metal thickness ratio of the contact part is remarkably improved. From this, it is understood that the wiring metal film thickness ratio increases depending on the etch-back ratio.

Here, description will be given to the shape of the wiring metal buried into the contact hole, which serves as a standard of electrical continuity.

When the etch-back ratio is 0% compared with the normal sputtering method (substrate temperature ≦300° C.), the amount of the buried wiring metal in the contact hole is approximately 80% of the depth of the contact hole, which shows an improvement, by the high temperature sputtering method. In the normal sputtering method with a small migration effect, when the amount of the buried wiring metal in the contact hole is approximately 80% of the depth of the contact hole, electrical continuity is sufficiently secured. However, in this high temperature sputtering method, as the migration effect of metal particles during high temperature sputtering is high, the wiring metal may be disconnected around the opening part of the contact hole. On the other hand, when the etch-back ratio is larger than or equal to 20%, though some recesses are caused to the surface of the wiring metal of the contact hole, the inside of the contact hole is completely filled with the wiring metal and the opening part of the contact hole shows a good step coverage. Therefore, it can be said that when the etch-back ratio is larger than or equal to 20%, a good contact can be obtained. Although the results of the experiment illustrated in FIG. 8 illustrate the etch-back ratio up to 80% it can easily be understood that even when the etch-back ratio is 100% a good contact can also be obtained.

From the above, it is desirable that the etch-back ratio should be set to 20% or more but under 100% not to allow the exposure of the Si substrate.

On the other hand, the relation between the etch-back ratio and the amount of the buried wiring metal in the contact hole is, as it is evident from FIG. 8, not so affected by the size of the contact hole. Therefore, a very small contact hole can be formed.

As described above, according to this embodiment, as the activation of the source/drain impurities and the reflow treatment to improve the shape of the opening part of the contact hole are provided together, the rediffusion of the drain/source impurities that occur when the activation of the source/drain impurities and the first reflow treatment after the BPSG film formation and the second reflow treatment after the contact hole formation to improve the shape of the opening part of the contact hole are performed separately can be restrained. In addition, as the recessed part of the BPSG film formed in the initial stage is so arranged not to reach the Si substrate, there is no possibility that the specified ions implanted to form the source/drain region 5' will be discharged to the outside, and therefore there is no possibility that the impurity density in the source/drain surface will fall during the source/drain region formation. Furthermore, as the opening part of the contact hole is formed so as to be funnel shaped with an "upwards convex" curvature, during the formation of the wiring metal film, metal particles can easily enter the inside of the contact hole due to the particle motion (migration) caused to the surface of the Si substrate by the kinetic energy received when the metal particles reach the surface of the Si substrate. As a result, the increase in the wiring metal resistance or the disconnection of the wiring metal which may occur when the opening part of the contact hole is "downwards convex" in curvature can be restrained.

In the above embodiment, the interlayer insulating film is formed by using the BPSG film with TEOS. It should be noted, however, that the same effects can be obtained by using the normal BPSG film with $SiH_4$ except for hygroscopicity.

Figure 3:
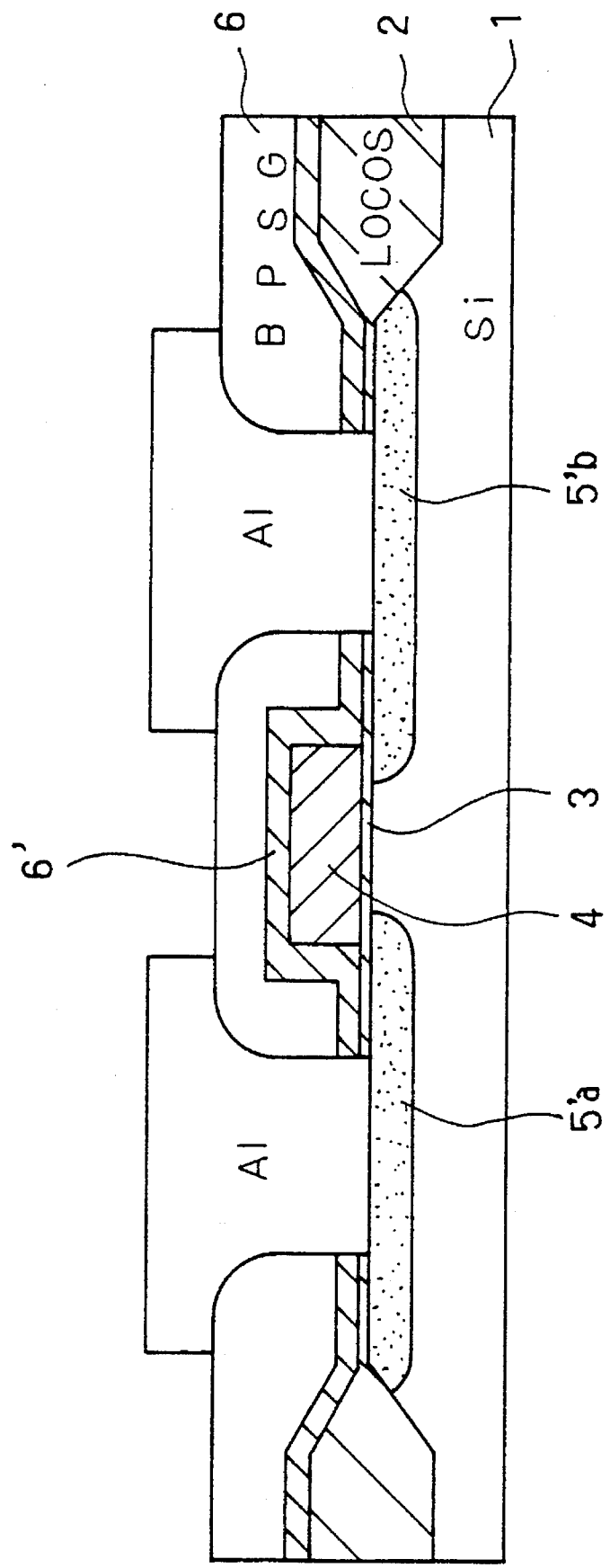
FIG. 3 is a cross-sectional view of a semiconductor device produced by means of the second embodiment according to the present invention.

As the second embodiment according to the present invention, as illustrated in FIG. 3, it is also acceptable that an insulating CVD film which does not contain impurities such as phosphorous and boron (e.g., CVD oxide film) is formed against a semiconductor substrate with the specified ions implanted by the iron implantation method to form source/drain regions 5'$a$ and 5'$b$, and further a BPSG film is formed by the above contact hole forming method to form a funnel shaped contact hole with an opening part having an "upward convex" curvature.

In this second embodiment, by inserting the above CVD film containing no impurities, the diffusion of the impurities within the BPSG film to the Si substrate, which occurs during the reflow treatment, can be prevented, and the decrease in the impurities density in the surface of the source/drain region can be restrained.

Furthermore, when a CVD film which has lower etching speed (or has the selectivity of etching) compared with the BPSG film as the CVD film containing no impurities, the uniformity of the recessed part depth of the entire semiconductor device can be improved by etching 100% the BPSG film in the etching process during the recessed part formation in the position in which the contact hole is to be formed with the CVD film 6' as an etching stopper. As a result, a funnel shaped contact hole with the highly uniform curvature of the opening part can be formed.

As described above, according to the present invention, heat treatment is performed to level a protective film formed over the surface of a semiconductor substrate, the opening part of a contact hole is formed to be funnel shaped with an "upwards convex" curvature so that metal particles can easily migrate into the contact hole, and at the same time, impurities are activated while the protective film is left over the surface of the semiconductor substrate. As a result, the present invention provides excellent effects that such problems with the prior arts as the rediffusion of the impurities or the separation of the impurities from the semiconductor substrate due to several heat treatments and as the disconnection of wiring metal within the contact hole due to the shape of the contact hole opening part can be solved all together. Consequently, a highly yieldable method of minutely producing a semiconductor device can be provided.

What is claimed is:

1. A method of producing a contact hole in a semiconductor device comprising the steps of:

implanting impurity ions into a portion of a semiconductor substrate;

forming a protective film over said semiconductor substrate including said portion thereof;

forming a recess in said protective film at a position thereof overlying said portion of said semiconductor substrate in which said impurity ions have been implanted by anisotropically etching said position of said protective film so as not to reach said underlying semiconductor substrate, whereby a layer of said protective film remains at a bottom of said recess;

supplementally implanting impurity ions into said portion of said semiconductor substrate via said recess defined in said protective film after said recess forming step;

heat treating said semiconductor substrate and said protective film causing said protective film to reflow so that said recess in said protective film is deformed into a shape wherein a periphery of an opening of said recess has a convex upward shape and so that said ions implanted into said semiconductor substrate are activated; and forming a contact hole in said layer of said protective film overlying said activated implanted ions by fully etching said deformed recess anisotropically through to said underlying semiconductor substrate.

2. The method of producing a contact hole in a semiconductor device according to claim 1, wherein said ions supplementally implanted have a same conductivity type as said ions previously implanted into said substrate.

\* \* \* \* \*